United States Patent
Posse (10) Patent No.: US 7,683,614 B2
(45) Date of Patent: Mar. 23, 2010

(54) MAGNETIC RESONANCE SPECTROSCOPY WITH SPARSE SPECTRAL SAMPLING AND INTERLEAVED DYNAMIC SHIMMING

(75) Inventor: Stefan Posse, 1616 Bayita Ln NW., Albuquerque, NM (US) 87107

(73) Assignee: Stefan Posse, Albuquerque, NM (US)

( * ) Notice: Subject to any disclaimer, the term of this patent is extended or adjusted under 35 U.S.C. 154(b) by 0 days.

(21) Appl. No.: 11/789,509

(22) Filed: Apr. 24, 2007

(65) Prior Publication Data

US 2007/0252597 A1    Nov. 1, 2007

Related U.S. Application Data

(60) Provisional application No. 60/795,379, filed on Apr. 27, 2006.

(51) Int. Cl.
*G01V 3/00* (2006.01)
(52) U.S. Cl. .................................... 324/307; 324/309
(58) Field of Classification Search ................ 324/307, 324/309
See application file for complete search history.

(56) References Cited

U.S. PATENT DOCUMENTS

| | | | | | |
|---|---|---|---|---|---|
| 5,079,505 | A | * | 1/1992 | Deimling et al. | 324/311 |
| 5,652,516 | A | * | 7/1997 | Adalsteinsson et al. | 324/309 |
| 6,304,084 | B1 | * | 10/2001 | Star-Lack et al. | 324/307 |

* cited by examiner

*Primary Examiner*—Louis M Arana (57) ABSTRACT

The present invention relates to a magnetic resonance spectroscopic imaging (MRSI) method, specifically to a magnetic resonance spectroscopic imaging method with up to three spatial dimensions and one spectral dimension. Interleaving dynamically switched magnetic field gradients into the spectroscopic encoding scheme enables multi-region shimming in a single shot to compensate the spatially varying spectral line broadening resulting from local magnetic field gradients. The method also employs sparse spectral sampling with controlled spectral aliasing and nonlinear sampling density to maximize encoding speed, data sampling efficiency and sensitivity.

11 Claims, 6 Drawing Sheets

MAGNETIC RESONANCE SPECTROSCOPY WITH SPARSE SPECTRAL SAMPLING AND INTERLEAVED DYNAMIC SHIMMING

REFERENCE TO RELATED APPLICATIONS

Applicant claims priority of U.S. Provisional Application No. 60/795,379, filed on Apr. 27, 2006 for SYSTEM AND METHODS FOR MAGNETIC RESONANCE SPECTROSCOPIC IMAGING AND LOCALIZED SPECTROSCOPY WITH NONLINEAR SAMPLING AND GRADIENT COMPENSATION of Stefan Posse, Applicant herein.

FEDERALLY SPONSORED RESEARCH

The present invention was made with government support under Grant No. 1 R01 DA14178-01 awarded by the National Institutes of Health. As a result, the Government has certain rights in this invention.

BACKGROUND OF THE INVENTION

1. Technical Field of the Invention

This invention relates to a magnetic resonance spectroscopic imaging (MRSI) method, specifically to a magnetic resonance spectroscopic imaging method with up to three spatial dimensions and one spectral dimension. The method employs sparse spectral sampling with controlled spectral aliasing and nonlinear sampling density to maximize encoding speed, data sampling efficiency and sensitivity, and to interleave additional spatial-spectral encoding into the spectroscopic encoding scheme. A preferred use is the interleaving of dynamically switched magnetic field gradients to enables multi-region shimming in a single shot to compensate the spatially varying spectral line broadening resulting from local magnetic field gradients.

2. Description of the Prior Art

Sparse spectral and spatial sampling in MR spectroscopy and spectroscopic imaging In MR spectroscopy (MRS) data sampling is equidistant in time to enable spectral reconstruction using the Fast Fourier Transform technique. The need to reduce data acquisition times of multidimensional NMR spectroscopy experiments has fostered considerable interest in novel data acquisition schemes (1-5). A recurring theme is that of reduced dimensionality experiments, in which time evolutions in the indirect dimensions are incremented together, rather than independently. Spectral analysis of such data is carried out using methods such as filtered backprojection, Generalized Fourier Transform, or parametric signal modeling. Such sparse data sampling methods are particularly advantageous in multidimensional NMR spectroscopy of complex bio-molecules. However, sparse spectral sampling in the primary spectral dimension has not been used so far, since there is no apparent benefit.

A class of spectroscopic imaging techniques, called SLIM (6) and SLOOP (7), uses anatomical information (e.g. using high resolution MRI) to define the shape of compartments with a spatially homogeneous spectral composition. This prior information is used to select phase encoding steps for spatial encoding to achieve the desired spatial response profile. Depending on the shape and number of compartments, this method can substantially reduce the number of phase encoding steps as compared to conventional phase encoding. In theory this approach allows super-resolution, i.e. no contamination between spectra from different compartments. However, SLIM is susceptible to inhomogeneities inside the chosen compartments, e.g. due to susceptibility and shimming, or due to different chemical species. These may lead to spectral contamination from neighboring compartments. SLOOP minimizes this effect by matching the point spread function to the shape of each compartment. Global optimization of localization scheme, i.e. optimal choice of phase encoding steps, remains a challenge. An alternative sparse k-space encoding has recently been described by Gao et al. (8). These methods are not widely used due to the complexity of designing optimal k-space trajectories and due to the fact that in clinical imaging applications the high-resolution MRI scans may only provide a biased reference for choosing compartments as biochemistry may change across space independently of the NMR properties of water.

High-Speed MR Spectroscopic Imaging:

High speed MRSI integrates spatial encoding modules into the spectral acquisition. We have developed Proton-Echo-Planar-Spectroscopic-Imaging (PEPSI) which employs echo-planar readout gradients to accelerate spatial encoding times by more than one order of magnitude as compared to conventional techniques to measure 2-dimensional metabolite distributions at short TE and 3-dimensional metabolite distributions (9,10). PEPSI has also been employed for time-resolved metabolic imaging to dynamically map lactate concentrations during respiratory and metabolic challenges (11, 12), to characterize metabolic dysfunction during sodium-lactate infusion in patients with panic disorder (13) and to map multiplet resonance in human brain at short echo time and high field strength (14). We have further increased the encoding speed of high-speed MRSI by combining Proton-Echo-Planar-Spectroscopic-Imaging (PEPSI) with parallel imaging to obtain up to 4-fold acceleration and measurement times of 16 s for a 32×32 matrix with TR 2 s (15) on a 4 Tesla scanner. This technology is particularly advantageous for 3-dimensional spatial mapping and further improvement in encoding efficiency enabled single-shot MRSI (16) in our laboratory.

Sparse spectral sampling has not yet been applied to MR spectroscopic imaging and localized MR spectroscopy. However, high-speed spectroscopic imaging makes the use of sparse spectral sampling useful, since it enables flexible trade-off between spectral and spatial sampling density for the purpose of accelerating spatial and spectral sampling. A major limitation of interleaved spatial-spectral encoding is the limited spectral bandwidth that can be achieved in a single excitation due to magnetic field gradient constraints. This leads to spectral aliasing, which current methodology compensates by spectral interleaving. Furthermore, integration of spatial encoding in a second and third spatial dimension during the spectroscopic acquisition is highly desirable, but this leads to even more severe spectral aliasing and this approach is limited by magnetic field gradient performance. As a consequence, MRSI techniques are very sensitive to movement and mapping of dynamically changing spectral patterns will lead to spatial and spectral blurring of the spectroscopic images. Encoding of large spatial matrices and 3-dimensional spatial encoding are very time consuming, even with high-speed MRSI methods.

Compensation of Magnetic Field Inhomogeneity

Magnetic resonance spectroscopic imaging and localized spectroscopy in vivo suffer from microscopic and macroscopic magnetic field inhomogeneity that broaden spectral lines, reduce sensitivity and impair spectral fitting. This is one of the major limitations of MRSI in vivo. Conventional means of compensating such inhomogeneity include: (a) shimming, which is limited to low shim coils with spatial frequencies and therefore not very effective over large volumes (b) separate acquisition of multiple volumes with different shim settings, which is time consuming (c) increasing spatial resolution, which is very costly in terms of sensitivity and increases measurement time.

Inhomogeneity of the static magnetic field ($B_0$) can be as large as 6 parts-per-million (ppm) across the brain (17,18). These spatial nonlinearities of local gradients are an important limiting factor in volumetric MRSI studies. Higher order auto-shimming (HOAS) provided on most high-field scanners offers limited capability for correction of such imperfections. While all MR processes will benefit from improved shimming to some degree, specific regions of clinical interest, such as the frontal and medial-temporal brain regions, and acquisition techniques, such as MRSI, can be critically affected by shimming effectiveness. In the case of MRSI, shim state can adversely affect spectral line width, causing artifactual frequency shifts between voxels and decrease effectiveness of water suppression. Furthermore, poorly suppressed water signal can alias into regions of otherwise adequate water suppression as a result of subject motion or k-space undersampling, causing baseline artifact. Aliasing of residual water signals from regions outside of the volume of interest is particularly difficult to identify.

HOAS typically uses a collection of shim coils based on spherical harmonics or other spatial shapes (for a review, see (19)). These coils are powered by current-feedback amplifiers under the control of a user-addressable interface and analysis program. The corrective fields generated by the coils are of finite number, power and extent. Due to time constraints, HOAS attempts to converge to an optimum shim state analytically rather than iteratively, using field maps collected with the existing imaging capability (20-24). Progress in improving existing technique has focused on addressing the limits of the shimming hardware (25-30) and accuracy and stability of the analysis (31,32). However, for spectroscopic imaging the performance of HOAS is still insufficient, in particular at high field.

To overcome large local disturbances in field homogeneity, several methods for correction have been proposed. The use of additional passive ferromagnetic shims in a cylindrical array, placed in close proximity to the human head, has been demonstrated (25). Mouthpieces containing diamagnetic shim material (passive shims) have been developed to enhance the $B_0$ homogeneity of the mesioinferior frontal lobes (26,27). Hsu and Glover (28) have taken a similar approach but have used a mouthpiece than contains an active shim coil. However, for clinical applications of spectroscopic imaging these approaches are not practical.

Extending the capability of the existing field coil design requires either more coils of higher order (29), or better control over the existing coils. To increase control, Blamire and colleagues (33) showed that a dynamic shim state, following the current acquisition slice, can improve the corrective power of the shim coils by reducing the spatial constraints on the shim state. Subsequent studies have further demonstrated its effectiveness (34). Dynamic shimming offers greater flexibility in compensating local magnetic field distortion, but applications are currently limited by the considerable hardware demands. However, the clinical manufacturers have identified dynamically switched higher order shims as an important advance and have started product development. It is thus foreseeable that switching higher order shims will become clinical routine.

Another form of dynamic shimming is the integration of pulsed shim gradient into the MR pulse sequence to compensate local magnetic field inhomogeneity at a particular echo time within the pulse sequence. In the fMRI literature single- and multi-shot gradient compensation schemes, such as Z-shimming (35) or multi-echo EPI (36) with interleaved gradient compensation have shown significant signal recovery in frontal and medial temporal regions. This latter approach has neither been applied to conventional MRS nor to MRSI. As a consequence, conventional methods to minimize the effects of local magnetic field inhomogeneity on spectral line width in MRSI require elongation of the measurement time or sacrificing signal-to-noise per unit time. Despite best efforts, these approaches are still limited and MRSI of the entire brain remains an elusive goal.

High-speed MR spectroscopic imaging has important applications.

The development of hyperpolarized MRI agents presents both unprecedented opportunities and new technical challenges. In particular, with signal-to-noise ratio (SNR) enhancements on the order of the 10000-fold, dynamic nuclear polarization of metabolically active substrates (e.g., 13C-labeled pyruvate or acetate) theoretically permits in vivo imaging of not only the injected agent, but also downstream metabolic products. This feature of hyperpolarized MR spectroscopy (MRS) provides investigators a unique opportunity to non-invasively monitor critical dynamic metabolic processes in vivo under both normal and pathologic conditions. Important applications include tumor diagnosis and treatment monitoring, as well as assessment of cardiac function. In studies using hyperpolarized samples, the magnetization decays toward its thermal equilibrium value and is not recoverable. Therefore, fast spectroscopic imaging acquisition schemes are important.

A recent study by Golman et al. (37) described real-time metabolic imaging. NMR spectroscopy has until now been the only noninvasive method to gain insight into the fate of pyruvate in the body, but the low NMR sensitivity even at high field strength has only allowed information about steady-state conditions. The medically relevant information about the distribution, localization, and metabolic rate of the substance during the first minute after the injection has not been obtainable. Use of a hyperpolarization technique has enabled 10-15% polarization of 13C1 in up to a 0.3 Mpyruvate solution. i.v. injection of the solution into rats and pigs allows imaging of the distribution of pyruvate and mapping of its major metabolites lactate and alanine within a time frame of 10 s.

Hyperpolarized MRS is currently being developed by major manufacturers and expected to be of considerable commercial value.

MR spectroscopic imaging in moving organs, like the heart or the breast, is sensitive to movement artifact that results in blurring of the image. Gating to the heart beat is frequently used to reduce motion artifact, but this reduces data acquisition efficiency. Simultaneous synchronization to respiration may be required to further reduce motion artifacts, which additionally reduces data acquisition efficiency. Gating in the presence of irregular heart beat introduces variability in repetition time that results in non steady-state signal intensity and distortion of the image encoding process. Image registration during post-processing is challenging due to the highly nonlinear movement pattern within the chest. High-speed spectroscopic imaging acquisition schemes considerably reduce motion sensitivity.

MR spectroscopic imaging in organs, like the brain, is sensitive to localized signal fluctuations due to blood pulsation or other physiological movement mechanisms (e.g. CSF movement) that results in blurring of the image. Gating to the rhythm of the physiological fluctuation (e.g. heart beat) can be used to reduce this artifact, but this reduces data acquisition efficiency. Gating in the presence of irregular heart beat introduces variability in repetition time that results in non steady-state signal intensity and distortion of the image encoding process. Therefore, fast spectroscopic imaging acquisition schemes are important.

Functional MRI is widely used to map changes in brain activation in animals and humans. However, the methodology lacks quantification due complex interdependence of the signal changes on blood flow, blood volume, oxygen extraction, vascular architecture and other factors. It also suffers from sensitivity to macroscopic off-resonance effects resulting from macroscopic magnetic field inhomogeneity and it is sensitive to physiological fluctuations (e.g. heart beat related blood pulsation) and movement. Furthermore, the widely used echo-planar-imaging (EPI) technique additionally suffers from image ghosting due to interference of signals acquired with opposite readout gradient polarity, which makes phase sensitive image reconstruction difficult. In our early work we have introduced PEPSI as a method to map the change in water spectra during functional brain activation (38), which however had limited temporal resolution. More recently we used multi-echo EPI (39), which enables quantitative mapping of T2*, but like all EPI based techniques suffers from ghosting artifacts and is thus not suitable for quantitative phase sensitive mapping. Fast and phase sensitive spectroscopic mapping of the water relaxation decay has the potential to provide considerably improve quantification of functional MRI, since the time course and phase of the decaying signal carry information about the blood volume, the blood vessel diameter distribution and intra-vascular signals in larger blood vessels (40,41). Fast acquisition speed is also important to reduce the influence of physiological fluctuations and movement.

This method is also applicable to spatial mapping chemical reactions for applications in material science and biology. For example, the spatial evolution of a chemical chain reaction could be observed. Such reactions are typically very fast and fast spectroscopic imaging acquisition schemes are thus important to avoid blurring of the spectroscopic images.

REFERENCES

1. Papoulis A. Generalized sampling expansion. IEEE Trans Circ Syst 1977; 24:652-654.
2. David Rovnyak, Multiple-quantum magic-angle spinning spectroscopy using nonlinear sampling Journal of Magnetic Resonance 161 (2003) 43-55
3. Szyperski T, Yeh D C, Sukumaran D K, Moseley H N, Montelione G T. Reduced-dimensionality NMR spectroscopy for high-throughput protein resonance assignment. Proc Natl Acad Sci USA. 2002 Jun. 11; 99(12):8009-14.
4. Kozminski W, Zhukov I. Multiple quadrature detection in reduced dimensionality experiments. J Biomol NMR. 2003 June; 26(2):157-66.
5. Mobli M, Stern A S, Hoch J C. Spectral reconstruction methods in fast NMR: reduced dimensionality, random sampling and maximum entropy. J Magn Reson. 2006 September; 182(1):96-105. Epub 2006 Jul. 11.
6. Hu X. et al. SLIM: Spectral localization by imaging. Magn Reson Med 8: 314-322, 1988.
7. Von Kienlin M., Meija R., Spectral localization with optimal point spread function. J. Magn. Reson. 94: 268-287, 1991.
8. Gao Y, Strakowski S M, Reeves S J, Hetherington H P, Chu W J, Lee J H. Fast spectroscopic imaging using online optimal sparse k-space acquisition and projections onto convex sets reconstruction. Magn Reson Med. 2006 June; 55(6): 1265-71.
9. Posse S, Tedeschi G, Risinger R, Ogg R, Le Bihan D. High speed 1H spectroscopic imaging in human brain by echo planar spatial-spectral encoding. Magn Reson Med 1995; 33(1):34-40.
10. Posse, S., Tedeschi, Risinger, G., Ogg, R., Le Bihan, D., High Speed 1H spectroscopic imaging, Magnetic Resonance in Medicine, 33, 34-40, 1995
11. Posse S, Dager S R, Richards T L, Yuan C, Ogg R, Artru A A, Muller-Gartner H W, Hayes C. In vivo measurement of regional brain metabolic response to hyperventilation using magnetic resonance: proton echo planar spectroscopic imaging (PEPSI). Magn Reson Med 1997; 37(6): 858-865.
12. Dager S R, Layton M E, Strauss W, Richards T L, Heide A, Friedman S D, Artru A A, Hayes C E, Posse S. Human brain metabolic response to caffeine and the effects of tolerance. Am J Psychiatry 1999; 156(2):229-237.
13. Dager S R, Friedman S D, Heide A, Layton M E, Richards T, Artru A, Strauss W, Hayes C, Posse S. Two-dimensional proton echo-planar spectroscopic imaging of brain metabolic changes during lactate-induced panic. Arch Gen Psychiatry 1999; 56(1):70-77.
14. Posse, S., Otazo, R., Caprihan, A., Bustillo, J., Chen, H., Henry, P.-G., Marjanska, M., Gasparovic, C., Zuo, C., Magnotta, V., Mueller, B., Mullins, P., Renshaw, P., Ugurbil, K., Lim, K. O., Alger, J. R., Proton Echo Planar Spectroscopic Imaging of J-Coupled Resonances in Human Brain at 3 and 4 Tesla, Magn. Reson. Med., in press
15. Lin, F.-H., Tsai, S.-Y., Otazo, R., Caprihan, A., Wald, L. L., Belliveau, J. W., Posse, S., Sensitivity-encoded (SENSE) Proton-Echo-Planar-Spectroscopic-Imaging (PEPSI) in Human Brain, Magn. Reson. Med., in press
16. Posse, S., Otazo, R., Tsai S-Y, Lin F-H., Single-Shot MR Spectroscopic Imaging with Partial Parallel Imaging, Abstract book: International Society for Magnetic Resonance in Medicine, 2007
17. Li S, Dardzinski B J, Collins C M, Yang Q X, Smith M B. Three-dimensional mapping of the static magnetic field inside the human head. Magn Reson Med. 1996 November; 36(5): 705-14. javascript:PopUpMenu2_Set (Menu8916021);
18. Collins C M, Yang B, Yang Q X, Smith M B. Numerical calculations of the static magnetic field in three-dimensional multi-tissue models of the human head. Magn Reson Imaging. 2002 June; 20(5):413-24.
19. Romeo F, Hoult D. I. Magnet field profiling: analysis and correcting coil design. Magn. Reson. Med. 1984 March; 1(1):44-65.
20. Prammer M G, Haselgrove, J. C., Shinnar, M., Leigh, J. S. A new approach to automatic shimming. J Magn Reson 1988; 77:40-52.
21. Webb P., Macovski A. "Rapid, fully automatic, arbitrary volume in vivo shimming" Magn Reson Med. 20(1), 113-22 (1991).
22. Schneider E., Glover G. "Rapid in vivo proton shimming" Magn Reson Med. 18(2), 335-47 (1991).
23. Hu, J., Javaid T., Arias-Mendoza F., Liu Z., Mc Namara R., and Brown T. R., "A fast, reliable, automatic shimming procedure using $^1$H chemical-shift imaging spectroscopy" J Magn Reson. 108, 213-219 (1995)
24. Reese T G, Davis, T. L., Weisskoff, R. M. Automated shimming at 1.5 T using echo planar image frequency maps. J Magn Reson Imaging 1995; 5(6):739-745.

25. Jesmanowicz A., Hyde J. S., Punchard W. F. B, and Starewicz P. M., "Method for shimming a static magnetic field in a local MRI coil", U.S. Pat. No. 6,294,972 Bi, Issued Sep. 25, 2001.
26. Wilson J L, Jezzard P. Utilization of an intra-oral diamagnetic passive shim in functional MRI of the inferior frontal cortex. Magn Reson Med 2003; 50(5):1089-1094.
27. Cusack R, Russell B, Cox S M, De Panfilis C, Schwarzbauer C, Ansorge R. An evaluation of the use of passive shimming to improve frontal sensitivity in fMRI. Neuroimage 2005; 24(1):82-91.
28. Hsu J J, Glover G H. Mitigation of susceptibility-induced signal loss in neuroimaging using localized shim coils. Magn Reson Med 2005; 53(2):243-248.
29. Hillenbrand D F, Lo, K-M, Punchard W F B, Reese T G, Starewicz P M. "High-order shimming: a simulation study of the effectiveness of competing methods, using an established susceptibility model of the human head", Applied Magnetic Resonance, Appl Magn Reson 29(1): 39-64, 2005.
30. de Graaf R. A., Brown P. B., McIntyre S., Rothman D. L., Nixon T. W. "Dynamic shim updating (DSU) for multislice shim acquisition" Magn. Reson. Med. 49(3), 409-16 (2003)
31. Kim D. H., Adalsteinsson E., Glover G. H., Spielman D. M. "Regularized high-order in vivo shimming" Magn Reson Med. 48(4), 715-22 (2002).
32. Klassen L. M., Menon R. S., "Robust automated shimming technique using arbitrary mapping acquisition parameters (RASTAMAP)" Magn Reson Med. 51(5), 881-7 (2004).
33. Blamire A M, Rothman D L, Nixon T. "Dynamic shim updating: a new approach towards optimized whole brain shimming." Magn Reson Med. 36(1) 159-65 (1996).
34. Zhao Y, Anderson A W, Gore J C. "Computer simulation studies of the effects of dynamic shimming on susceptibility artifacts in EPI at high field." J Magn Reson. 173(1) 10-22 (2005).
35. Deichmann R, Josephs O, Hutton C, Corfield D R, Turner R. Compensation of susceptibility-induced BOLD sensitivity losses in echo-planar fMRI imaging. Neuroimage. 2002 January; 15(1): 120-35.
36. Posse, S., Shen, Z., Kiselev, V. G., Kemna, L. J., Single-Shot T2* Mapping with 3D Compensation of Local Susceptibility Gradients in Multiple Regions, NeuroImage 2003 February, 18(2):390-400.
37. Golman K, in 't Zandt R, Thaning M. Real-time metabolic imaging. Proc Natl Acad Sci USA. 2006 Jul. 25; 103(30): 11270-5. Epub 2006 Jul. 12.
38. Posse, S., Wiese, S., Behr, D., Grosse-Ruyken, M.-L., Shah, N. J., Richards, T., Dager, S. R., Müller-Gärtner, H.-W.: Detection of Brain Activity by Oxygenation Sensitive Proton Echo Planar Spectroscopic Imaging (PEPSI). Abstract book: International Society for Magnetic Resonance in Medicine; 376, 1997
39. Posse, S., Wiese, S., Gembris, D., Mathiak, K., Kessler, C., Grosse-Ruyken, M.-L., Elghawagh, B., Richards, T., Dager, S. R., Kiselev, V. G., Enhancement of BOLD-Contrast Sensitivity by Single-Shot Multi-Echo Functional MR Imaging, Magnetic. Resonance. Med., 42 (1): 87-97, 1999.
40. Kiselev, V. G., Posse, S., Theory of Susceptibility induced NMR Signal Dephasing in a Cerebrovascular Network., Physical Review Letters, 81:5696-5699, 1998.
41. Kiselev, V., Posse, S., Analytical Model of Susceptibility induced MR Signal Dephasing: Effect of Diffusion in a Microvascular Network., Magnetic Resonance in Medicine, 41 (3): 499-509, 1999
42. Devroye L, A course in density estimation, Birkhauser Boston Inc. Cambridge, Mass., USA, 1987
43. Oppenheim, A. V., Schafer, R. W., Buck, J. R., Discrete-Time Signal Processing (2nd Edition) (Hardcover), Second Edition, Prentice Hall Signal Processing Series, 1998
44. Sarkar, I., Fam, A. T., The interlaced chirp Z transform, Signal Processing, 86 (9) 2221-2232, 2006
45. Bagchi, S., Mitra, S. K., The nonuniform discrete Fourier transform and its applications in signal processing Kluwer Academic Publishers, Norwell, Mass., USA, 1999

SUMMARY OF THE PRESENT INVENTION

The present invention has a magnetic resonance spectroscopic imaging (MRSI) method that allows collecting a complete spectroscopic image with one spectral dimension and up to three spatial dimensions. The method employs sparse spectral sampling with controlled spectral aliasing and nonlinear sampling density to maximize encoding speed, data sampling efficiency and sensitivity, and to interleave additional spatial-spectral encoding into the spectroscopic encoding scheme. A preferred use is the interleaving of dynamically switched magnetic field gradients to enables multi-region shimming in a single shot to compensate the spatially varying spectral line broadening resulting from local magnetic field gradients. In addition to this application several other applications are possible. For example, instead of interleaving gradients without collecting data it is possible to design k-space trajectories as a function of spectral encoding time that are optimally designed to (a) minimize the effects of local magnetic field gradients or (b) to sample additional spatial dimensions. Combining these methods with sparse spectral sampling using optimal sampling density to maximize spectral information content enables maximally efficient spatial and spectral sampling in a single shot. This methodology is also applicable to conventional single voxel MRS to dynamically compensate regional variation of magnetic field inhomogeneity inside the voxel.

This method has important clinical and neuroscience applications. Hyperpolarized MR spectroscopy (MRS) provides investigators a unique opportunity to non-invasively monitor critical dynamic metabolic processes in vivo under both normal and pathologic conditions. Important applications include tumor diagnosis and treatment monitoring, as well as assessment of cardiac function. The rapid decay of the hyperpolarized signal requires fast MR spectroscopic imaging and regional differences in magnetic field homogeneity can be compensated in a single shot using interleaved dynamic shimming.

Spectroscopic imaging in moving organs, like the heart, is sensitive to movement artifact that results in blurring of the image and considerably regional differences in magnetic field inhomogeneity. Fast MR spectroscopic imaging techniques with interleaved gradient compensation can substantially reduce motion sensitivity and spectral line broadening, thereby enhance the robustness of spatial-spectral encoding.

Spectroscopic imaging in the brain is sensitive to localized signal fluctuations due to blood pulsation or other physiological movement mechanisms that results in blurring of the image. Fast MR spectroscopic imaging techniques with interleaved gradient compensation can substantially reduce motion sensitivity and spectral line broadening, thereby enhance the robustness of spatial-spectral encoding.

Current functional MRI techniques lack quantification and they are sensitive to head movement and physiological fluctuations. Fast MR spectroscopic imaging techniques with interleaved gradient compensation can substantially improve quantification of functional MRI, reduce effects of regional differences in magnetic field inhomogeneity and reduce sensitivity to head movement and physiological fluctuations.

Fast MR spectroscopic imaging techniques also enable spatial mapping of chemical reactions for applications in material science and reduce blurring in the spectroscopic images.

A pulse sequence with interleaved gradient compensation has been developed and implemented on the 1.5 Tesla Sonata MRI scanner. Data were measured on a phantom with metabolite solutions and the data were reconstructed into spectroscopic images to show proof-of-concept.

BRIEF DESCRIPTION OF THE DRAWINGS

FIG. 8: (a) Uncompensated 4 Tesla spectra from (a) posterior brain and (b) anterior cingulate. (c) The same anterior cingulate voxel after compensation shows much reduced line width. (d) Composite NAA map shows improved sensitivity in frontal brain.

DETAILED DESCRIPTION OF THE INVENTION

Figure 1:
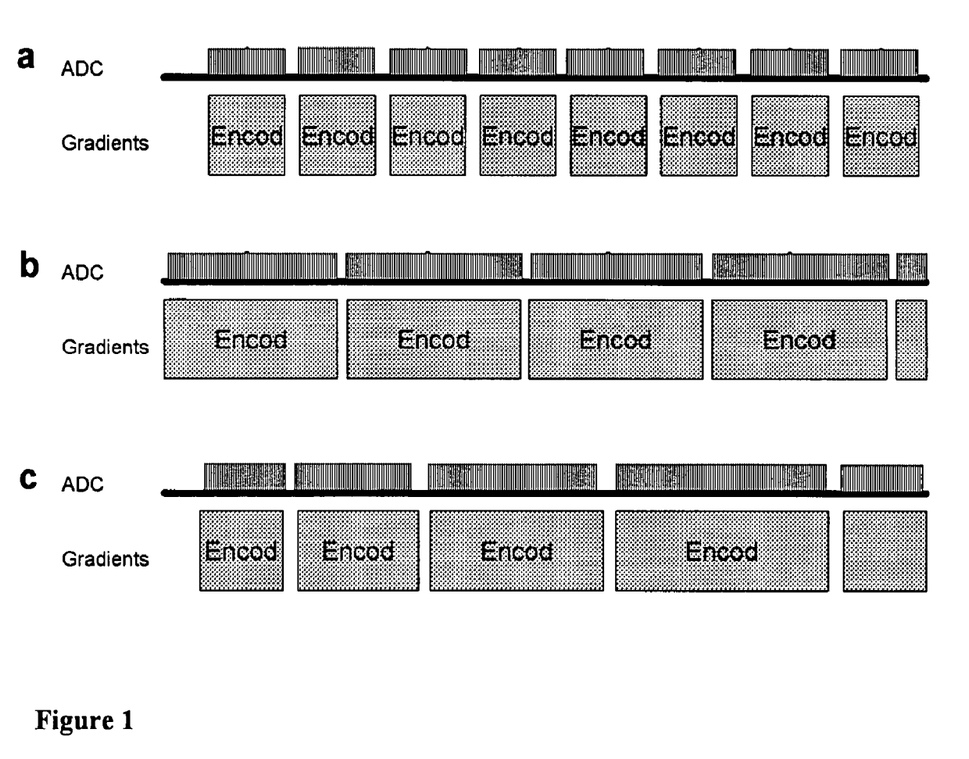
FIG. 1 shows schematically the different time domain sampling schemes with interleaved gradient encoding modules (Encod): (a) full bandwidth equidistant sampling, (b) equidistant undersampling in the time domain (c) nonlinear spectral sampling with increasing spectral dwell time. The encoding block duration in case c) may increase or decrease monotonically, or change non-monotonically. The spacing of the encoding blocks symbolizes the spectral sampling raster. The increase in the size of the gradient encoding module symbolizes the increase in k-space encoding coverage and/or encoding gradient strength. Gradients and ADC sampling may only be applied during part of the encoding blocks. Spacing between encoding blocks is a guide to the eye.
Figure 2:
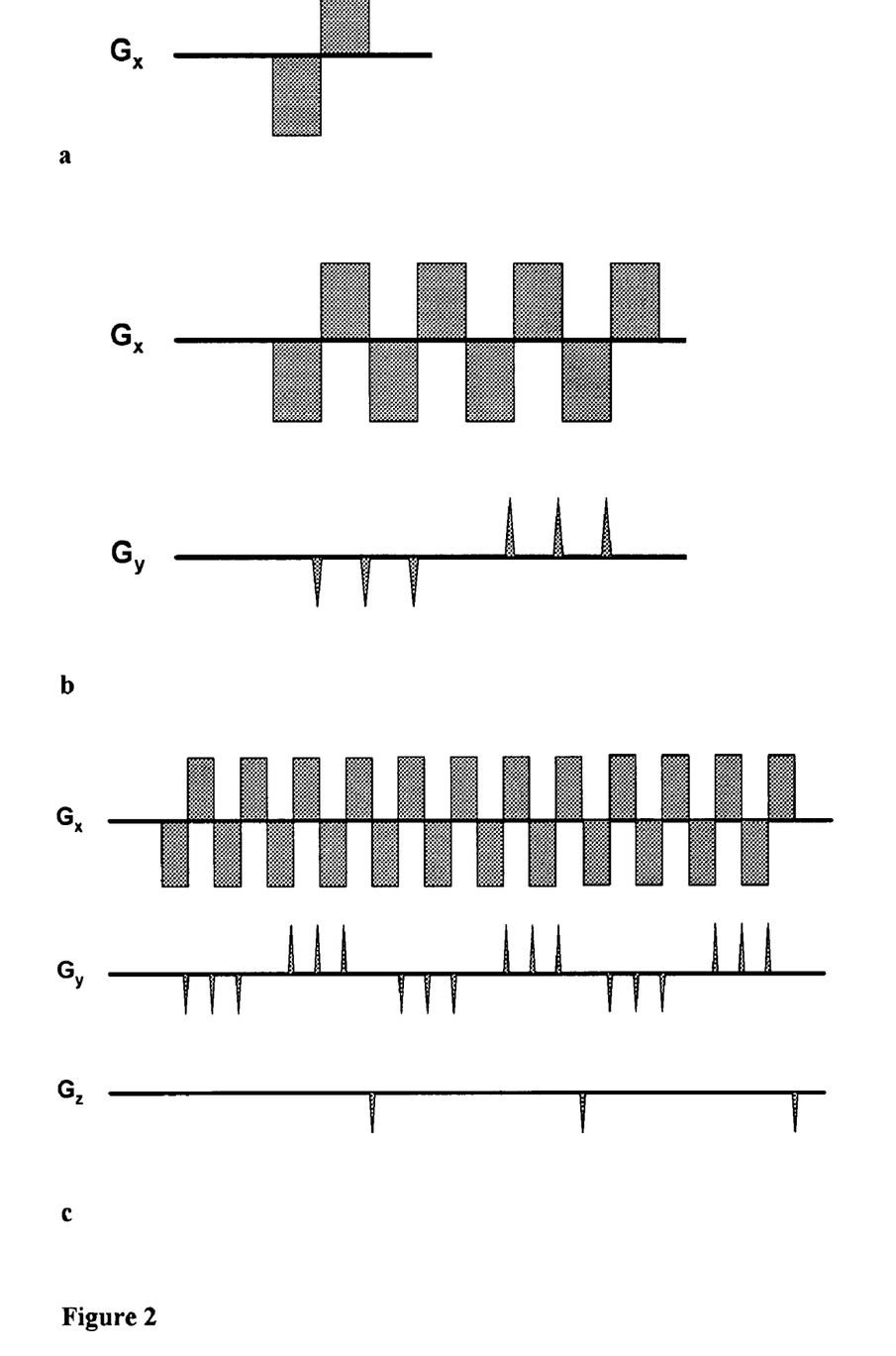
FIG. 2 illustrates examples of encoding modules but not limited to these: (a) 1D encoding (b) 2D single-shot encoding (c) 3D single shot encoding.
Figure 3:
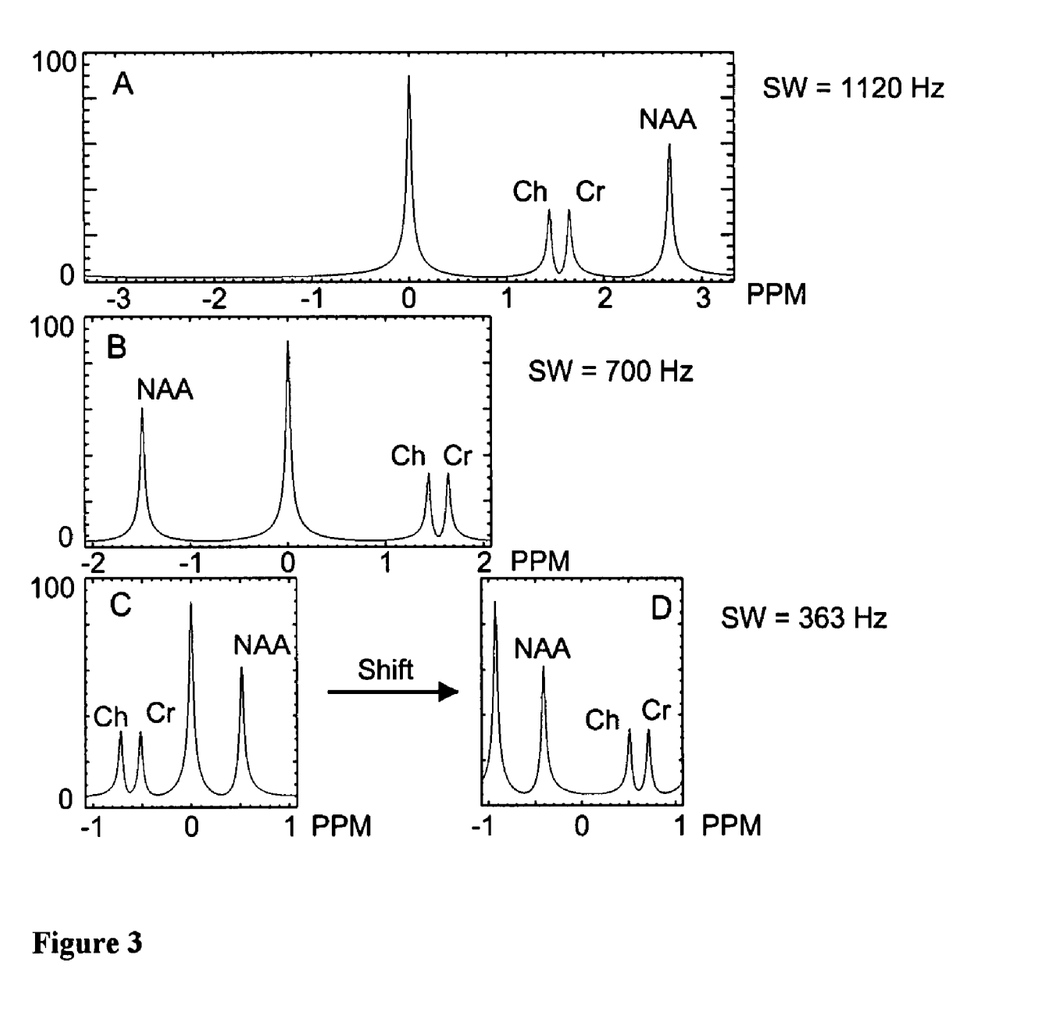
FIG. 3 illustrates spectral aliasing as a function of the sampled spectral width when using linear sampling.

In MRS and MRSI the dwell time for spectroscopic encoding depends on the nucleus. In proton spectroscopy the spectral range is rather narrow (9 ppm=380 Hz/Tesla) and the necessary dwell time to encode the entire spectral range is on the order of 1.75 ms at 1 Tesla and 0.88 ms at 3 Tesla, which are commonly used field strengths. This is sufficient time between spectral encoding points to interleave magnetic field gradient pulses (FIG. 1,2). This is now common practice for high-speed MRSI (e.g. 9,10). Sparse sampling can be implemented such that the spectral dwell time for linear time domain sampling is increased at the expense of spectral aliasing. A key element of this approach is to select the spectral dwell time such that minimal loss of spectral information is incurred in the aliased spectrum (FIG. 3,4). Aliased data may be reconstructed using constrained spectral models. Alternatively, non-uniform sampling of spectral data points in time can be used and this approach can be combined with increasing the spectral dwell time to further reduce sampling density. The preferred implementation of this case involves the use of linear or nonlinear, but not necessarily monotonous, increase in spectral dwell time. Known approaches to design the sampling raster based on the known spectral pattern and to reconstruct the data include Kernel Density Estimation (42), the chirp Z-transform (43), the interlaced chirp Z-transform (44) and the non-uniform digital Fourier transform (45). The following methods may also be used to reconstruct the data: filtered backprojection, Generalized Fourier Transform, or parametric signal modeling (1-5).

The elongated spectral dwell time enables interleaving of gradient encoding modules into the spectroscopic acquisitionto sample additional data points between spectral dwell points, which convolves spectral information and information encoded by the new gradient encoding modules. While insertion of readout gradients has been customary for high-speed MRSI (e.g. 9,10), the extra time allows interleaving of additional spatial encoding gradients (e.g. to encode a second and third spatial dimension) and/or dynamic shim gradients into the k-t space trajectory (FIG. 1). More generally, extended k-space trajectories can be designed as a function of spectral acquisition time to compensate the effects of spatially varying local magnetic field gradients by acquiring multiple data sets that are shimmed for different regions.

Interleaving a series of alternating short gradient pulses, which counteracts the dephasing effects of local intrinsic gradients, into the spectroscopic acquisition is intended to improve overall spectral resolution. The amplitude of these gradient pulses increases with time in accordance with the increase in local gradient moments and the duration of these gradient pulses is either constant or may increase in time as the gradient moments increases. These gradient pulses can be inserted at regular intervals between each of the spectroscopic data points while maintaining linear data sampling (method a) or alternatively inserted at increasing time intervals while the frequency of data acquisition is adjusted accordingly as the data acquisition progresses (method b). As a consequence two (or more) data sets (subsets) with different gradient compensation parameters can be collected in a single acquisition to compensate local gradients in one or multiple spatial locations, thus obtaining more uniform narrow line width in the reconstructed spectroscopic data set. More generally, gradient compensation vector trajectories can be designed to serially compensate within a single gradient waveform a complex distribution of local gradient vectors. Ideally, the switched compensation gradients should consist of linear and higher order spatial components (i.e. an expansion of spatial harmonics) to increase compensation efficiency for regions with spatially nonlinear local gradients. The data sets obtained with different compensation gradients can be combined by selecting the data with the smallest line width in each location or weighted averaging, to achieve maximum overall sensitivity.

For method a the sampling frequency for each data subset is constant throughout and all spectral components are encoded with equal spectral width. For method b, the sampling frequency for each data subset decreases nonlinearly during the time course of the data acquisition due to the decreasing time intervals between gradient pulses for compensation. This method is advantageous, since it can be optimized according to gradient performance and gradient stimulation constraints. A limitation of linear spectral sampling is that the gradient slew rate of the blipped compensation gradients at the end of the readout train, which may lead to peripheral nerve stimulation. In order to increase SNR per unit time and unit volume and to reduce the possibility of peripheral nerve stimulation we will be using blipped compensation gradients that increase in duration during the readout gradient train. Specifically, the duration between consecutive readout gradients will initially be very short and increase in accordance with the required gradient moment for compensation. This will ensure that the data acquisition of the spectroscopic half-echo starts with high duty cycle, which maximizes SNR. The interleaving of compensation gradients is not limited to a single set of compensation gradients. In principle, multiple sets of compensation gradients can be applied, however, at correspondingly reduced spectral width and data acquisition efficiency. The benefit of this methodology is single-shot compensation of local gradients in one or more regions of interest, which is advantageous for 3D acquisition and 2D time resolved acquisition. A disadvantage of the method is the decrease in SNR per unit time as a function of the number of separately shimmed data sets and the reduced duty cycle of the data acquisition.

Nonlinear spectral sampling has the following features: Broad spectral components are thus sampled with full spectral bandwidth, whereas narrow spectral components are sampled with reduced spectral bandwidth. Narrow spectral components may thus experience aliasing, but in vivo spectra are composed mostly of broad components and relatively few narrow peaks. By using appropriate choice of the spectroscopic sampling bandwidth the spectral overlap of narrow peaks in the aliased spectrum can be minimized and spectral information can be more evenly distributed in frequency space. More generally, the sampling intervals can be adjusted to match the expected information density based on a priori modeling of the spectra. Known approaches to design the sampling raster based on the known spectral pattern and to reconstruct the data include Kernel Density Estimation (42), the chirp Z-transform (43), the interlaced chirp Z-transform (44) and the non-uniform digital Fourier transform (45). By adding prior information about the known spectral frequencies, line widths and line shapes a complete deconvolution can be achieved. To reconstruct such nonlinearly sampled data alternative reconstruction methods, such as filtered back-projection, Generalized Fourier Transform, parametric signal modeling or maximum entropy methods, may be used (1-5). The advantage of this method is that overall sampling rate can either be (a) decreased during the data acquisition to improve signal-to-noise per unit time and unit volume (b) kept constant, thus maintaining signal-to-noise per unit time and unit volume, while compensating local gradients without increasing measurement time or (c) increased at a controlled rate to minimize the penalty in signal-to-noise per unit time and unit volume with gradient compensation.

This method can be applied to single voxel localized spectroscopy to compensate local gradients in different parts of the voxel, or to spectroscopic imaging to compensate local gradients in different parts of the spectroscopic image. This acquisition can be combined with echo-planar spectra-spatial encoding, which is particularly well suited for this type of gradient compensation. This method may also be applicable to functional magnetic resonance imaging and high resolution in vitro magnetic resonance spectroscopy. We expect that future shim designs will incorporate active shielding, which will make this approach entirely feasible and provide increased flexibility for choosing optimum gradient trajectories for compensation of local magnetic field inhomogeneities.

The spectral aliasing approach has multiplet benefits beyond interleaved shimming, such as accelerating the following two applications.

Use of longer readout gradients enables much higher spatial resolution and/or reduced ramp sampling as compared to full spectral width sampling. This is particularly advantageous at high field where gradient slew rate limitations translate into substantial time spent on ramp sampling, which is inefficient in terms of SNR per unit time and unit volume. Furthermore, with large bandwidth trajectories the readout must be along the X-direction to avoid peripheral nerve stimulation. The use of longer readout gradients reduces gradient stimulation and thus permits readout along the Y-axis, which is the long axis of the brain. The phase encoding matrix in the X-direction can thus be reduced, which accelerates spatial encoding.

Interleaving of additional spatial encoding gradients, such as alternating phase encoding gradient blips between the readout gradients as described in (16) to acquire multiple k-space line per excitation to accelerate k-space encoding. Combining this approach with parallel imaging enables single-shot 2D spectroscopic imaging.

Interleaving can be done between adjacent readout gradients, which does not allow combination of even and odd echoes and results in first order phase errors, or between pairs of readout gradient to minimize first-order phase errors. Regridding in the k-t-plane is necessary to minimize first-order phase errors.

Figure 4:
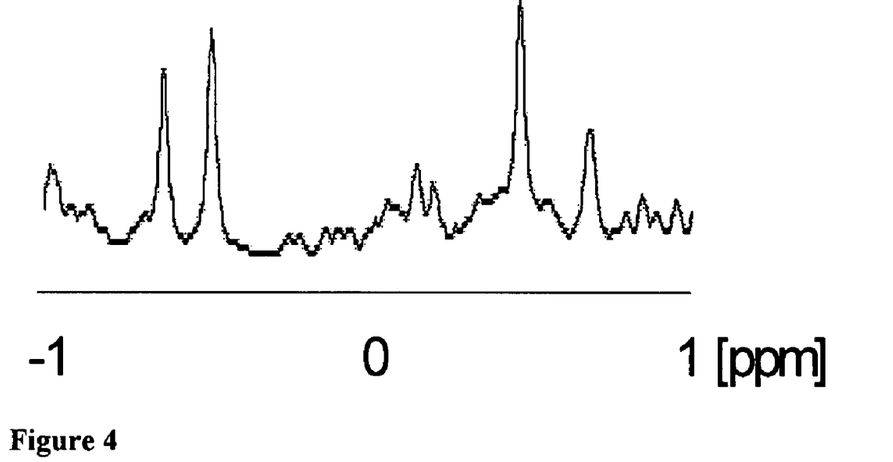
FIG. 4 shows a simulated short TE (15 ms) in vivo 3 T spectrum with 4-fold aliasing showing dominant peaks from Cho, Cr and NAA. The water peak at 0 ppm has been omitted for clarity.

It is now of interest to assess the feasibility of applying this approach to the measurement of short echo time spectra where spectral information is much denser and spectral overlap is therefore much stronger than at long echo times simulated in FIG. 3. Tuning the spectral width to minimize spectral interference and overlap with residual water will become more challenging. The aim is to improve the separation of dominant multiplet resonances (inositol and glutamate) with LCModel fitting. Spectral interference, which is aggravated by J-modulation, is expected to be minimized at very short echo times. FIG. 4 shows a simulated spectrum at TE 15 ms at 3 Tesla with 272 Hz spectral width, which would allow 4-fold acceleration of phase encoding as compared to the conventional PEPSI sequence. The multiplet resonances are clearly separated from the singlets. Even multiplet resonances from inositol and glutamate are clearly distinguishable. Spectral fitting of multiplets under conditions of spectral aliasing is expected to be more robust at high field strength.

However, there are two obvious limitations with this approach: (i) Spectral aliasing puts high demands on the suppression of the water signal, which would appear in the center of the spectrum and on the modeling of macromolecular spectra. (ii) The Cramer Rao Lower Bounds of the spectral fit, in particular of the multiplets, are expected to be higher than with full spectral sampling, which will vary among multiplets depending on the spectral pattern. These increases need to be characterized as a function of spectral width to find minima that are suitable for in vivo studies.

Experimental validation of Single-Shot Gradient Compensation of Susceptibility Induced Line Broadening in PEPSI.

Figure 5:
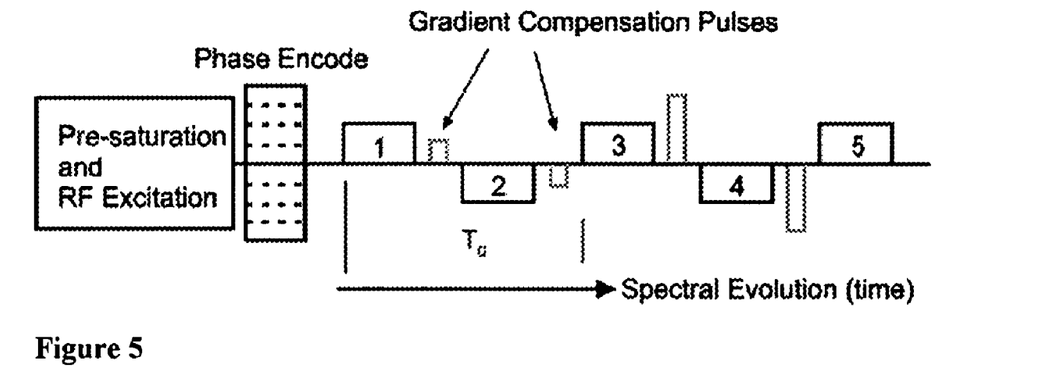
FIG. 5 shows a schematic PEPSI pulse sequence with compensation gradients along X, Y and Z-axes interleaved between each readout gradient of the PEPSI sequence ($T_d$=dwell time after sorting of even and odd echoes).
Figure 6:
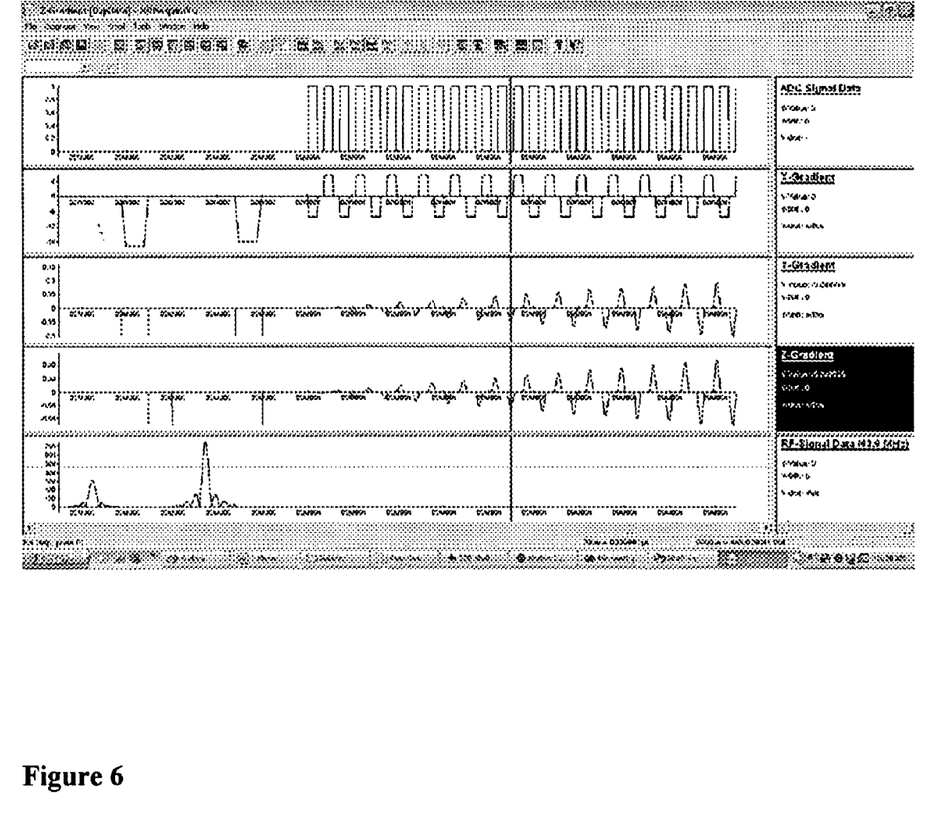
FIG. 6 shows a simulation of a spin-echo PEPSI high speed spectroscopic imaging pulse sequence with interleaved shim gradients that was implemented on a Siemens scanner. Alternating compensation gradient blips are applied along the Y- and Z-axes. Blips are interleaved with PEPSI readout gradients that are applied along the X-axis. This example of gradient compensation corresponds to method a (linear sampling). The ADC trace shows segments of data acquisition that correspond to a single spectral acquisition point and 1-dimensional spatial encoding. Alternating gradient compensation is thus applied between each spectral acquisition point to collect two sets of data—one compensated for local gradients and one uncompensated data set.

The new method was integrated into a Proton Echo-Planar spectroscopic imaging (PEPSI) sequence (9,10,14) and uses a train of alternating gradient pulses of increasing strengths, interleaved into the spatial-spectral encoding scheme, to simultaneously collect an uncompensated and a compensated data set (FIG. 5,6). Controlled spectral aliasing was used to overcome gradient slew rate and stimulation limitations. The NAA and the choline/creatine peaks now fall on the opposite sides of the water peak and can be deconvolved by suitable techniques.

The PEPSI method acquires two data sets in a single scan, a compensated data set for local gradients GI in regions that suffer from susceptibility related spectral line broadening and a non-compensated data set from magnetically homogeneous regions. The new method uses a train of alternating compensation gradient pulses $G_c$ of linearly increasing gradient moment along all three spatial axes, interleaved into the spatial-spectral encoding scheme (FIG. 5,6). In order to compensate the kth readout gradient we require that the gradient moments observe $(2k-1)G_l T_d = G_c T_c$, where $T_d$ is the dwell time after sorting even and odd echoes and $T_c$ is the duration of the compensation gradient. However, gradient slew rate and stimulation limitations at the end of the gradient train require decreasing the spectral width, which introduces spectral aliasing. To control spectral aliasing to avoid interference of the major metabolite peaks the spectral width was selected as a function of field strength using a minimization procedure. The NAA and the choline/creatine peaks now fall on the opposite sides of the water peak and can be deconvolved by suitable techniques (FIG. 3).

Brain scans on 5 healthy subjects were performed on a 4 Tesla Bruker MedSpec scanner equipped with a Siemens console and Sonata gradients. PEPSI data were collected with TR: 2 sec, TE: 50 ms, spatial matrix: 32×32, pixel size: 10×10 mm2, and slice thickness of 15 mm. Water-suppressed (8 averages) and non-water-suppressed (1 average) data were obtained, resulting in 10 minute scan time. The compensation gradients were calculated based on phase difference images obtained from a dual echo gradient echo sequence. For Td=1.34 ms and Tc=0.73 ms (see FIG. 3), the maximum local gradient that can be compensate is 0.0426 mT/m. The maximum gradient amplitude (40 mT/m) with 256 readout gradients inversions is reached after 686 msec, which provides adequate spectral resolution at 4 T. The maximum local gradient strength that could be compensated with this approach was 0.0426 mT/m.

Figure 7:
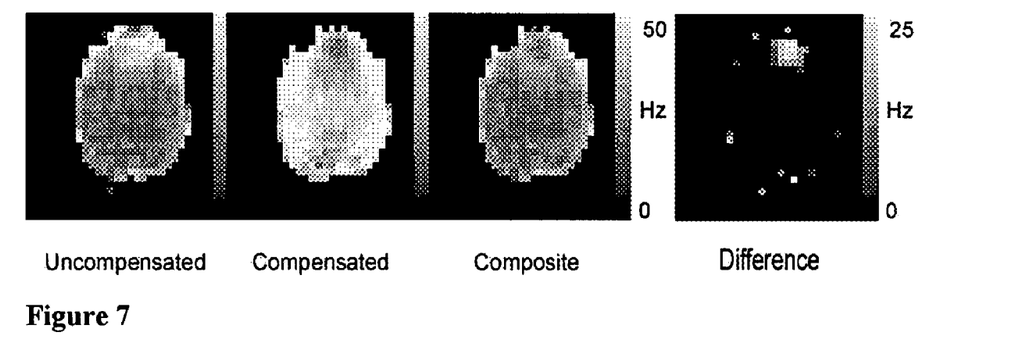
FIG. 7 is a water line width maps at 4 Tesla in vivo without (left) and with (center) linear gradient compensation. The composite map (right) shows more uniform line width across the slice.
Figure 8A:
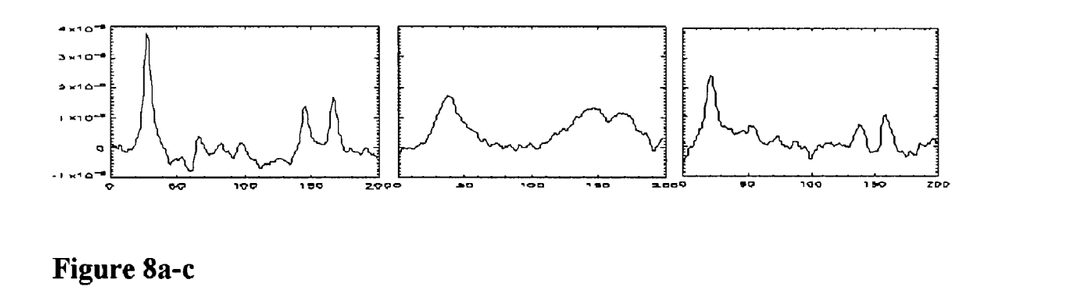
Figure 8D:
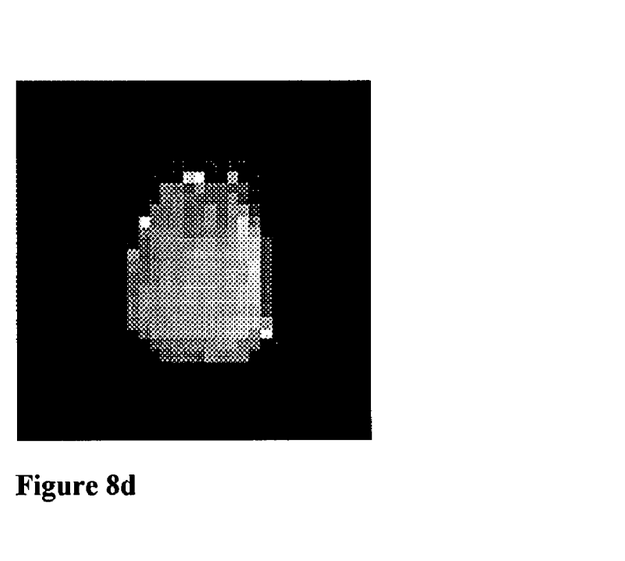

FIGS. 7 and 8 show improved line width and spectral quality with gradient compensation in anterior cingulate. Applying gradient compensation incurs an SNR penalty due to the decreased sampling efficiency and splitting of even and odd echoes, which is $\sqrt{2(T_d/(T_d-T_c))}$. Furthermore, the use of linear compensation gradients limits the efficiency of this approach in regions with nonlinear local gradients.

To investigate the feasibility of linear gradient compensation in different brain region we obtained whole brain gradient echo phase at 4 Tesla in 9 subjects and examined histograms of the amplitude and angular distribution of local gradients in 4 brain regions. The dispersion of local gradients angles and amplitudes was much larger in ventral prefrontal cortex and inferior temporal cortex as compared to dorsal prefrontal cortex and medial inferior temporal lobe, which will thus be the targets of our method development.

What is claimed is:

1. A method of magnetic resonance spectroscopic imaging (MRSI) comprising the steps of:
   a) placing an object to be imaged in a magnetic field aligned along an axis (z);
   b) exciting nuclei in said object to excite desired spectral components for imaging;
   c) encoding the NMR signal from said object in one spectral dimension and in up to 3 spatial dimensions (X,Y,Z) using magnetic field gradient pulses;
   d) acquiring equally spaced spectral data points using a receiver with a dwell time that defines a desired maximum spectral width, said maximum spectral width being smaller than the maximum frequency separation between said spectral components, resulting in spectral aliasing;
   e) iteratively increasing said receiver dwell time using a desired step size until the spectral separation of any two of said spectral components exceeds a desired minimum spectral separation;
   f) detecting said spectral data points; and
   g) reconstructing said spectral data points into a set of spatially localized spectra.

2. The method according to claim 1, further comprising the step of:
   h) using a duration of said receiver dwell time that results in matching of the expected information density based on a priori modeling of the localized spectra, using one of the following known approaches: Kernel Density Estimation, the chirp Z-transform, the interlaced chirp Z-transform, the non-uniform digital Fourier transform, filtered backprojection, Generalized Fourier Transform and parametric signal modeling.

3. The method according to claim 1, wherein spatial encoding in up to three spatial dimensions is performed in a single shot using a plurality of spatial encoding modules, each consisting of a plurality of cyclically inverted echo-planar readout gradients to encode one spatial dimension (X) and interleaved phase encoding gradient pulses to encode up to two orthogonal spatial dimensions (Y, Z), creating a series of gradient echo signals, the remaining spatial dimension(s) being encoded using conventional phase encoding.

4. A method of magnetic resonance spectroscopic imaging (MRSI) comprising the steps of:
   a) placing an object to be imaged in a magnetic field aligned along an axis (z);
   b) measuring the mean local magnetic field gradient vector in a desired region within said object;
   c) exciting nuclei in said object to excite desired spectral components for imaging;
   d) encoding the NMR signal from said object in one spectral dimension and in up to 3 spatial dimensions (X,Y,Z) using magnetic field gradient pulses;
   e) acquiring equally spaced spectral data points using a receiver with a dwell time that defines a desired spectral width;
   f) interleaving a plurality of shim gradient pulses with alternating and pair wise increasing gradient moments between said spectral data acquisition points using a correspondingly longer receiver dwell time that decreases the spectral width, resulting in two interleaved series of spectral data acquisition points measured with different shim setting, wherein the gradient moment of the first shim gradient pulse is equal to the inverse of the moment of said mean local magnetic field gradient vector integrated over one receiver dwell time and the second shim gradient pulse moment is the inverse of the first shim gradient pulse moment, wherein the increment of said shim gradient pulse moments for subsequent odd-numbered shim gradient pulses is equal to the inverse of the moment of said mean local magnetic field gradient vector integrated over two consecutive receiver dwell times and subsequent even-numbered shim gradient moments are the inverse of the preceding odd-numbered shim gradient moments;

e) separating and reconstructing the two interleaved series of spectral data points to form two spectroscopic images; and g) combining the two spectroscopic images by selecting in each voxel the spectrum with the smallest spectral line width.

5. The method according to claim 4, wherein the mean local magnetic field gradient vectors are measured in two or more desired regions within said object and two or more series of shim gradient pulses with alternating and pair wise increasing gradient moments are interleaved between said spectral data acquisition points, wherein for each of said series of shim gradient pulses the spacing in units of dwell time between consecutive pairs of odd- and even-numbered shim gradient pulses is increased in correspondence to the total number of desired regions within said subject minus one, wherein said series of shim gradient pulses are delayed in time with respect to each other by at least one dwell period, wherein the moments of the first gradient pulse pair are increased in accordance with said increased spacing in units of dwell time between consecutive pairs of odd- and even-numbered shim gradient pulses, wherein the increment of the gradient moments of each of said series of shim gradient pulses is increased in accordance with the increased spacing between odd-numbered shim gradient pulses, wherein three or more series of spectral data points are separated and reconstructed to form three or more spectroscopic images, wherein the effective spectral width in said reconstructed spectroscopic images is reduced by the number of desired regions within said subject plus one, and wherein said spectroscopic images are combined by selecting from these spectroscopic images in each voxel the spectrum with the smallest spectral line width.

6. The method according to claim 5 wherein said receiver dwell time is iteratively increased using a desired step size until the spectral separation of any two of said spectral components exceeds a desired minimum spectral separation.

7. The method according to claim 5, wherein the receiver dwell time increases with increasing spectral encoding time and shim gradient pulses with correspondingly longer duration are applied, and wherein one of the following known approaches to design the sampling raster and to reconstruct spatially localized spectroscopic data is used: Kernel Density Estimation, the chirp Z-transform, the interlaced chirp Z-transform, the non-uniform digital Fourier transform, filtered backprojection, Generalized Fourier Transform and parametric signal modeling.

8. The method according to claim 5, wherein spatially nonlinear pulsed shim gradient are employed that null the signal dispersion due to spatially nonlinear local magnetic field gradient vectors in said desired regions of the object.

9. The method according to claim 5, wherein spatial encoding in up to three spatial dimensions is performed in a single shot using a plurality of spatial encoding modules, each consisting of a plurality of cyclically inverted echo-planar readout gradients to encode one spatial dimension (X) and interleaved phase encoding gradient pulses to encode up to two orthogonal spatial dimensions (Y, Z), creating a series of gradient echo signals, the remaining spatial dimension(s) being encoded using conventional phase encoding.

10. A method of magnetic resonance spectroscopic imaging (MRSI) comprising the steps of:
   a) placing an object to be imaged in a magnetic field aligned along an axis (z);
   b) measuring the vector distribution of the maxima of the local magnetic field gradients in a desired region within said object;
   c) exciting nuclei in said object to excite desired spectral components for imaging;
   d) encoding the NMR signal from said object in one spectral dimension and in up to 3 spatial dimensions (X,Y,Z) using a plurality of spatial encoding modules, each consisting of a plurality of cyclically inverted echo-planar readout gradients to encode one spatial dimension (X) and interleaved phase encoding gradient pulses to encode up to two orthogonal spatial dimensions (Y, Z), creating a series of gradient echo signals, the remaining spatial dimension(s) being encoded using conventional phase encoding, the repetition of spatial encoding modules encoding the spectral dimension;
   e) incrementing the extent of the encoded k-space with each repetition of said spatial encoding module, the increment in encoded k-space corresponding to the inverse of the vector distribution of the maxima of the local magnetic field gradient moments in said region within said object integrated over the duration of the corresponding spatial encoding module;
   f) acquiring said series of gradient echo signals using a receiver;
   g) spatially reconstructing a spectroscopic image by extrapolating k-space of said spatial encoding modules using zero-filling to match the k-space extent of the last spatial encoding module and Fourier transforming the data set along all encoding dimensions;
   h) using one of the following known approaches to design the encoding duration of said spatial encoding modules and to reconstruct spatially localized spectroscopic data: Kernel Density Estimation, the chirp Z-transform, the interlaced chirp Z-transform, the non-uniform digital Fourier transform, filtered backprojection, Generalized Fourier Transform and parametric signal modeling; and
   i) downsampling in the spatial domain by combining voxel data, if increased signal-to-noise ratio is desired.

11. The method according to claim 10, wherein spatially nonlinear pulsed gradient are employed for image encoding, improving compensation of spatially nonlinear local magnetic field gradient vectors and reducing the duration of spatial encoding modules.

* * * * *